(12) United States Patent
Ham et al.

(10) Patent No.: US 10,705,613 B2
(45) Date of Patent: Jul. 7, 2020

(54) DISPLAY DEVICE

(71) Applicant: LG Display Co., Ltd., Seoul (KR)

(72) Inventors: Yong-Su Ham, Seoul (KR); Taeheon Kim, Seoul (KR); YongWoo Lee, Goyang-Si (KR); Kyungyeol Ryu, Goyang-Si (KR); YuSeon Kho, Seoul (KR); MyungJin Lim, Goyang-Si (KR)

(73) Assignee: LG Display Co., Ltd., Seoul (KR)

( * ) Notice: Subject to any disclaimer, the term of this patent is extended or adjusted under 35 U.S.C. 154(b) by 11 days.

(21) Appl. No.: 15/820,204

(22) Filed: Nov. 21, 2017

(65) Prior Publication Data

US 2018/0164888 A1   Jun. 14, 2018

(30) Foreign Application Priority Data

Dec. 9, 2016   (KR) .................. 10-2016-0167348

(51) Int. Cl.
| | | |
|---|---|---|
| *G06F 3/01* | (2006.01) | |
| *G06F 3/041* | (2006.01) | |
| *H01L 41/047* | (2006.01) | |
| *H01L 41/193* | (2006.01) | |
| *H01L 41/113* | (2006.01) | |
| *G02F 1/1333* | (2006.01) | |
| *G02F 1/1335* | (2006.01) | |

(Continued)

(52) U.S. Cl.
CPC .......... *G06F 3/016* (2013.01); *G02F 1/13338* (2013.01); *G06F 3/041* (2013.01); *H01L 41/0477* (2013.01); *H01L 41/0478* (2013.01); *H01L 41/1132* (2013.01); *H01L 41/193* (2013.01); *G02F 1/1368* (2013.01); *G02F 1/133514* (2013.01); *G02F 1/136286* (2013.01); *G02F 2201/123* (2013.01); *G06F 3/044* (2013.01); *G06F 3/0412* (2013.01); *G06F 2203/014* (2013.01)

(58) Field of Classification Search
CPC ...... G06F 3/016; G06F 1/1368; G06F 3/0412; G06F 3/044; G02F 1/13338; G02F 1/133514; G02F 1/1368; G02F 2201/123; G02F 1/136286; G02G 1/136286
See application file for complete search history.

(56) References Cited

U.S. PATENT DOCUMENTS 9,182,820 B1 * 11/2015 Hebenstreit .......... G09B 21/003
2009/0002328 A1 * 1/2009 Ullrich .................... G06F 3/016
345/173

(Continued)

FOREIGN PATENT DOCUMENTS

| EP | 1310860 A1 | 5/2003 |
|---|---|---|
| KR | 101632665 | 6/2016 |

OTHER PUBLICATIONS

Partial European Search Report for European Patent Application No. EP 17206286, dated Feb. 23, 2018, 17 Pages.

(Continued)

*Primary Examiner* — Kent W Chang
*Assistant Examiner* — Sujit Shah
(74) *Attorney, Agent, or Firm* — Fenwick & West LLP

(57) ABSTRACT

Provided is a display device. The display device includes a display panel, a vibration transfer layer, and a touch sensitive element. The vibration transfer layer is disposed under the display panel and has a plurality of openings. The touch sensitive element is disposed under the vibration transfer layer.

20 Claims, 10 Drawing Sheets

(51) Int. Cl.
G02F 1/1362 (2006.01)
G02F 1/1368 (2006.01)
G06F 3/044 (2006.01)

(56) References Cited

U.S. PATENT DOCUMENTS

| | | | | |
|---|---|---|---|---|
| 2012/0162113 | A1* | 6/2012 | Lee | G08B 6/00 345/173 |
| 2012/0232243 | A1* | 9/2012 | Namiki | B29C 45/0001 528/371 |
| 2013/0002093 | A1* | 1/2013 | Kim | G06F 3/016 310/324 |
| 2013/0044049 | A1 | 2/2013 | Biggs et al. | |
| 2014/0104216 | A1* | 4/2014 | Adachi | G06F 3/041 345/173 |
| 2014/0347283 | A1* | 11/2014 | Kim | G06F 3/016 345/173 |
| 2015/0116231 | A1* | 4/2015 | Kim | G06F 3/016 345/173 |
| 2016/0170539 | A1* | 6/2016 | Watanabe | H04M 19/047 345/173 |
| 2016/0313793 | A1* | 10/2016 | Hong | G06F 3/016 |
| 2016/0328019 | A1* | 11/2016 | Taninaka | G06F 3/016 |
| 2016/0358724 | A1* | 12/2016 | Liao | H01H 13/85 |

OTHER PUBLICATIONS

European Patent Office, Extended European Search Report and Opinion, EP Patent Application No. 17206286.1, dated May 14, 2018, 14 pages.

* cited by examiner

DISPLAY DEVICE

CROSS-REFERENCE TO RELATED APPLICATIONS

This application claims the priority of Republic of Korea Patent Application No. 10-2016-0167348 filed on Dec. 9, 2016, in the Korean Intellectual Property Office, the disclosure of which is incorporated herein by reference in its entirety.

BACKGROUND

Field

The present disclosure relates to a display device and more particularly, to a display device including a touch sensitive element that provides haptic effects of improved vibration intensity.

Description of the Related Art

A touch element is a device configured to sense a user's touch input such as a touch on a screen of a display device. The touch element has been widely used for portable display devices such as a smart phone, a tablet personal computer (PC), and large-sized display devices such as a display device in a public facility and a smart TV. Operational mode of the touch element may include a resistive mode, a capacitive mode, an optical mode, an electromagnetic (EM) mode, and the like.

However, recently, a touch sensitive element capable of sensing a user's touch input and also providing haptic effects that allow the user to feel various haptic sensations with his/her finger or stylus as feedback on the user's touch input has been researched.

As examples of the touch sensitive element, a touch sensitive element using an eccentric rotating mass (ERM), a touch sensitive element using a linear resonant actuator (LRA), a touch sensitive element using a piezo ceramic actuator, and the like have been used. However, the above-described touch sensitive elements are formed of opaque materials and configured to vibrate not a specific part of a display device but the entire display device. Further, the above-described touch sensitive elements cannot provide various vibration sensations and have low durability and thus can be easily broken by external shocks.

In order to solve the above-described problems, a touch sensitive element using an electro active polymer (EAP) is being researched. The touch sensitive element using the EAP is thin and flexible and thus can be easily applied to various display devices. However, the touch sensitive element using the EAP has a lower vibration intensity and a higher driving voltage than the ERM, LRA, and piezo ceramic actuator. Particularly, if the touch sensitive element using the EAP is disposed under a display panel, vibrations of the touch sensitive element cannot be sufficiently transferred to the user through the display panel. Accordingly, research on the technology capable of improving the vibration intensity of the touch sensitive element is needed.

SUMMARY

An object to be achieved by the present disclosure is to provide a display device with improved vibration intensity.

Another object to be achieved by the present disclosure is to provide a display device having a first resonant frequency corresponding to a frequency of a voltage to be applied to a touch sensitive element.

The objects of the present disclosure are not limited to the aforementioned objects, and other objects, which are not mentioned above, will be apparent to a person having ordinary skill in the art from the following description.

According to an aspect of the present disclosure, there is provided a display device. The display device comprises: a display panel; a touch sensitive element under the display panel, the touch sensitive element configured to vibrate responsive to an application of voltage to the touch sensitive element; and a vibration transfer layer between the display panel and the touch sensitive element, the vibration transfer layer comprising a plurality of openings, and the vibration transfer layer configured to transmit the vibration generated by the touch sensitive element to the display panel. Thus, a displacement space for contraction and expansion of the touch sensitive element is not limited, and vibrations of the touch sensitive element can be easily transferred to an upper side of the display panel.

According to another aspect of the present disclosure, there is provided a display device. The display device comprises: a display panel; a touch sensitive element under the display panel, the touch sensitive element comprising: an electro active layer; a plurality of first electrodes on a first surface of the electro active layer, the plurality of first electrodes separated from each other; and a second electrode on a second surface of the electro active layer that is opposite the first surface, the electroactive layer configured to vibrate responsive to applying a voltage difference between the second electrode and at least one of the plurality of first electrodes; and a vibration transfer layer between the display panel and the touch sensitive element, the vibration transfer layer comprising a plurality of openings that each correspond to one of the plurality of first electrodes, the vibration transfer layer configured to transmit the vibration generated by the electro active layer to the display panel The electro active layer of the touch sensitive element can contract and expand in a vertical direction within the plurality of openings of the vibration transfer layer. Thus, the blocking force of the touch sensitive element can be improved and the vibration intensity of a module in which the vibration transfer layer and the touch sensitive element are combined can be improved.

Details of other exemplary embodiments will be included in the detailed description of the invention and the accompanying drawings.

According to the present disclosure, it is possible to improve the blocking force of a module in which a touch sensitive element and a vibration transfer layer are combined. Thus, it is possible to improve the vibration intensity of a display device.

Further, according to the present disclosure, it is possible to control a first resonant frequency of the display device so as to correspond to a frequency of a driving voltage to be applied to the touch sensitive element.

The effects of the present disclosure are not limited to the aforementioned effects, and various other effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
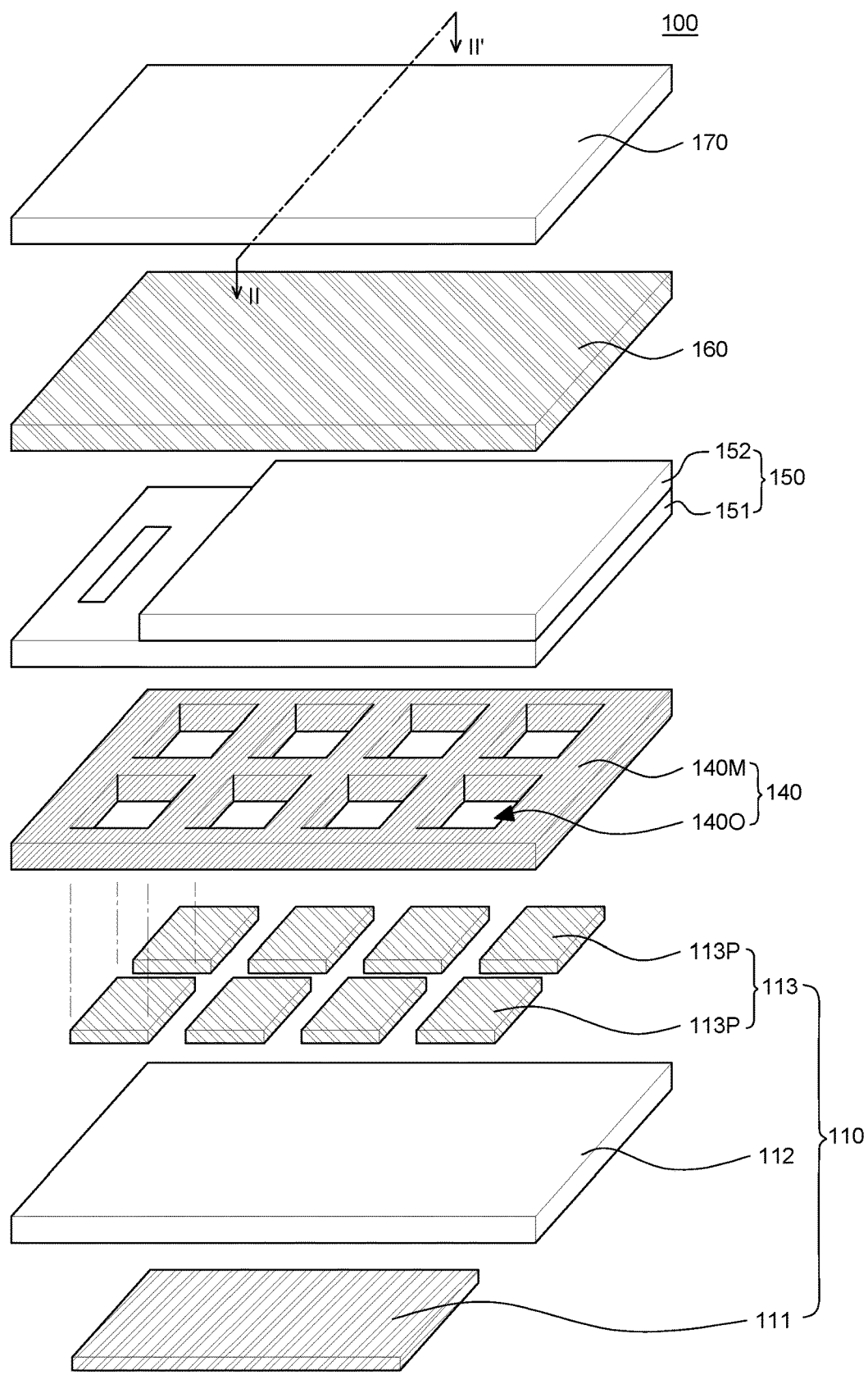
FIG. 1 is an exploded perspective view of a display device according to an exemplary embodiment of the present disclosure.

Advantages and features of the present disclosure, and methods for accomplishing the same will be more clearly understood from exemplary embodiments described below with reference to the accompanying drawings. However, the present disclosure is not limited to the following exemplary embodiments but may be implemented in various different forms. The exemplary embodiments are provided only to complete disclosure of the present disclosure and to fully provide a person having ordinary skill in the art to which the present disclosure pertains with the category of the invention, and the present disclosure will be defined by the appended claims.

The shapes, sizes, ratios, angles, numbers, and the like illustrated in the accompanying drawings for describing the exemplary embodiments of the present disclosure are merely examples, and the present disclosure is not limited thereto. Further, in the following description, a detailed explanation of well-known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since the size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

Hereinafter, various exemplary embodiments of the present disclosure will be described in detail with reference to the accompanying drawings.

Figure 2:
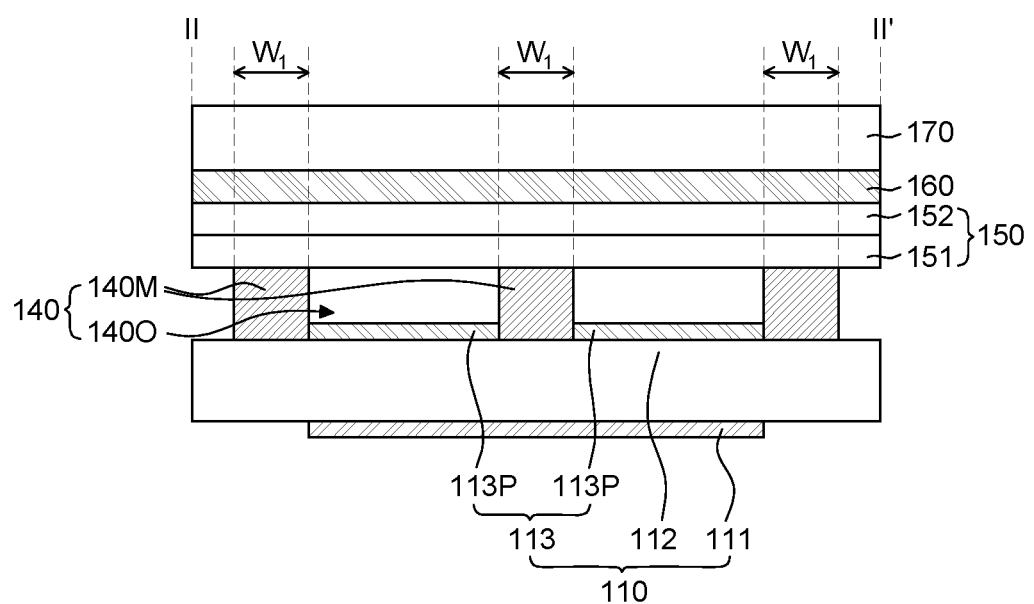
FIG. 2 is a cross-sectional view taken along a line II-II' of FIG. 1 according to an exemplary embodiment of the present disclosure.
Figure 3:
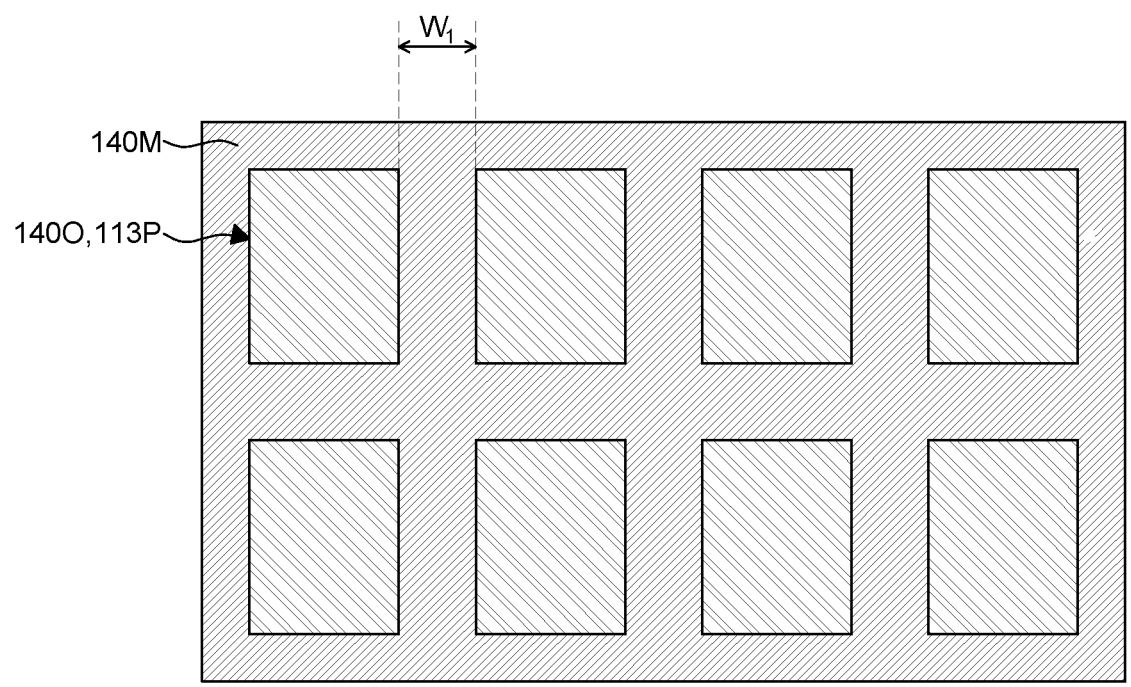
FIG. 3 is a schematic plan view of a vibration transfer layer and a plurality of pattern electrodes of the display device according to an exemplary embodiment of the present disclosure.

FIG. 1 is an exploded perspective view of a display device according to an exemplary embodiment of the present disclosure. FIG. 2 is a cross-sectional view taken along a line II-II' of FIG. 1 according to an exemplary embodiment of the present disclosure. FIG. 3 is a schematic plan view of a vibration transfer layer and a plurality of pattern electrodes of the display device according to an exemplary embodiment of the present disclosure. Referring to FIG. 1 through FIG. 3, a display device 100 includes a touch sensitive element 110, a vibration transfer layer 140, a display panel 150, a touch element 160, and a cover window 170.

The display panel 150 is configured to display an image on the display device 100 and includes a first substrate 151 and a second substrate 152. On the first substrate 151, various display elements are disposed, and the second substrate 152 protects the display elements disposed on the first substrate 151. For example, if the display panel 150 is configured as a liquid crystal display panel, a data line and a gate line intersecting with each other are disposed on the first substrate 151. Further, a thin film transistor connected to the data line and the gate line, a capacitor, and a pixel electrode connected to the thin film transistor are disposed on the first substrate 151. Also, a color filter may be disposed on the second substrate 152. In FIG. 1 and FIG. 2, the display elements disposed on the first substrate 151 are omitted. However, the display panel 150 is not limited to the liquid crystal display panel. The display panel 150 may also be configured as various display panels such as an organic light emitting display panel, an electrophoretic display panel.

The touch element 160 refers to a panel configured to sense a user's touch input on the display device 100. As the touch element 160, for example, a capacitive type, resistive type, surface acoustic wave type or infrared ray type touch element may be used. In one embodiment, a capacitive type touch element may be used as the touch element 160.

The cover window 170 is disposed on the touch element 160 and configured to protect the components under the cover window 170 against external shocks, foreign materials, or moisture. For example, the cover window 170 may be formed of glass having excellent stiffness or plastic which can be thermoformed and has excellent formability.

Although FIG. 1 and FIG. 2 illustrate the cover window 170, the touch element 160, and the display panel 150 as separate components, some of these components may be integrated with each other in some exemplary embodiments. For example, the touch element 160 may be integrated with the cover window 170. In this case, a touch electrode is disposed on a rear surface of the cover window 170 and the cover window 170 functions as a cover substrate of the touch element 160 configured to protect the touch electrode. Also, the touch element 160 may be integrated with the display panel 150. In this case, the touch electrode may be disposed on the first substrate 151 or under the second substrate 152 of the display panel 150.

The vibration transfer layer 140 is disposed under the display panel 150 and formed into a mesh pattern as illustrated in FIG. 1. The vibration transfer layer 140 is configured to transfer vibrations of the touch sensitive element 110 to an upper side of the display device 100. The vibration transfer layer 140 will be described in detail later.

The touch sensitive element 110 includes an electro active layer 112, a first electrode layer 113, and a second electrode layer 111. The electro active layer 112 is a plate-shaped film formed of an electro active polymer which is deformed by electrical stimulation. For example, the electro active layer 112 may be formed of a silicon (Si)-based, polyurethane (PU)-based or acryl-based dielectric elastomer or a relaxor ferroelectric polymer such as P(VDF-TrFE-CFE)(poly(vinylidene fluoride-trifluoroethylene-chlorofluoroethylene) and P(VDF-TrFE-CTFE)(poly(vinylidene fluoride-trifluoroethylene-chlorotrifluoroethylene). The electro active layer 112 may be formed of a dielectric elastomer. In this case, when a voltage is applied to the first electrode layer 113 and the second electrode layer 111, the dielectric elastomer may be contracted and expanded by a Coulombic force acting on the electro active layer 112 and the touch sensitive element 110 may vibrate. Also, the electro active layer 112 may be formed of a relaxor ferroelectric polymer. In this case, when a voltage is applied to the electro active layer 112, the alignment direction of dipoles within the electro active layer 112 is changed. Thus, the electro active layer 112 is contracted and expanded and the touch sensitive element 110 may vibrate.

The first electrode layer 113 and the second electrode layer 111 are disposed on both surfaces of the electro active layer 112. For example, the first electrode 113 is disposed on an upper surface of the electro active layer 112 and the second electrode layer 111 is disposed on a lower surface of the electro active layer 112. The first electrode layer 113 and the second electrode layer 111 are configured to apply a voltage to the electro active layer 112 and formed of a conductive material. For example, the first electrode layer 113 and the second electrode layer 111 may be formed of a metal material such as gold (Au), copper (Cu), titanium (Ti), chromium (Cr), molybdenum (Mo), aluminum (Al), an aluminum-copper alloy (Al—Cu alloy). Otherwise, the first electrode layer 113 and the second electrode layer 111 may be formed of a conductive polymer such as PEDOT[Poly (3,4-EthyleneDiOxyThiophene)]:PSS[Poly(4-StyreneSulfonic acid)], polypyrrole, polyaniline. Also, the first electrode layer 113 and the second electrode layer 111 may be configured as soft electrodes manufactured by mixing carbon conductive grease, carbon black or carbon nanotube (CNT) with an elastomer so as to be suitable for smooth and repetitive driving of the touch sensitive element 110. The first electrode layer 113 and the second electrode layer 111 may be formed of the same material, or may be formed of different materials from each other.

The first electrode layer 113 includes a plurality of pattern electrodes 113P. In this case, an area where the plurality of pattern electrodes 113P is disposed is defined as a haptic cell. Herein, the haptic cell is a minimum unit capable of transferring haptic feedback to a user. Each haptic cell can independently transfer haptic feedback. Specifically, a driving voltage may be applied to only anyone of the plurality of pattern electrodes 113P. In this case, an electric field is generated between the pattern electrode applied with the driving voltage and the second electrode layer 111 and a part of the electro active layer 112 disposed between the pattern electrode applied with the driving voltage and the second electrode layer 111 vibrates. Thus, haptic feedback can be generated. In this case, the plurality of pattern electrodes is connected to a plurality of lines, respectively. Thus, the plurality of pattern electrodes can be individually supplied with a driving voltage through the plurality of lines, respectively.

The area of the pattern electrodes 113P corresponds to the area of haptic cells, and the area of each haptic cell may be determined considering the size of a finger of a general person. The touch sensitive element 110 is configured to transfer haptic feedback on the user's touch input. Thus, the haptic cell as a minimum unit capable of transferring haptic feedback to the user may be determined considering the area of the user's touch input. In this case, the area of the user's touch input is determined depending on the size of a finger of a general person, and, thus, the area of the haptic cell can also be determined on the basis of the size of a finger of a general person.

In some exemplary embodiments, the area of the haptic cell may also be determined considering the area of a touch cell of the touch element 160 which can be used together with the touch sensitive element 110. Herein, the touch cell of the touch element 160 refers to a minimum unit capable of sensing the user's touch input. If the area of the haptic cell is determined considering the area of the touch cell of the touch element, the haptic cells may one-to-one correspond to the touch cells of the touch element. In this case, the touch sensitive element 110 can provide haptic feedback to the exact spot where the user's touch input is applied.

The second electrode layer 111 is configured including a single electrode. In this case, a reference voltage may be applied to the second electrode layer 111. For example, the second electrode layer 111 may be grounded. In this case, an electric field is applied to the electro active layer 112 on the basis of a potential difference between the second electrode layer 111 and the pattern electrodes 113P of the first electrode layer 113. However, the second electrode layer 111 is not limited thereto. The second electrode layer 111 may include a plurality of second pattern electrodes corresponding to the pattern electrodes 113P of the first electrode layer 113. In this case, the haptic cells of the touch sensitive element 110 may generate vibrations of various frequencies. Specifically, voltages of different frequencies from each other may be applied between the second pattern electrodes and the pattern electrodes 113P corresponding thereto. In this case, the second pattern electrodes and the haptic cells corresponding to the pattern electrodes 113P corresponding to the second pattern electrodes may generate vibrations of different frequencies, respectively.

The vibration transfer layer 140 includes a vibration transfer part 140M and a plurality of openings 140O. The vibration transfer part 140M refers to a part corresponding to the mesh pattern of the vibration transfer layer 140, and the plurality of openings 140O refers to open spaces in the mesh pattern. The vibration transfer part 140M is in contact with the electro active layer 112 between the pattern electrodes 113P of the first electrode layer 113 as illustrated in FIG. 2 and FIG. 3. That is, the vibration transfer part 140M is disposed between the pattern electrodes 113P. In this case, a boundary line of the vibration transfer part 140M matches a boundary line of each pattern electrode 113P. For example, the vibration transfer part 140M has a first width W1 and the pattern electrodes 113P are separated from each other at a distance corresponding to the first width W1.

The plurality of openings 140O corresponds to the pattern electrodes 113P, respectively. Since the boundary line of the vibration transfer part 140M matches the boundary line of the pattern electrode 113P, a boundary line of the opening 140O matches a boundary line of the pattern electrode 113P corresponding thereto. Thus, the area of each opening 140O matches the area of each pattern electrode 113P.

The vibration transfer part 140M transfers vibrations of the electro active layer 112 to the display panel 150 on the upper side, and the openings 140O provide a space for contraction and expansion of the electro active layer 112. A process of vibration of the electro active layer 112 and a process of transferring vibrations of the electro active layer 112 through the vibration transfer part 140M will be described in detail with reference to FIG. 4A and FIG. 4B.

Figure 4A:
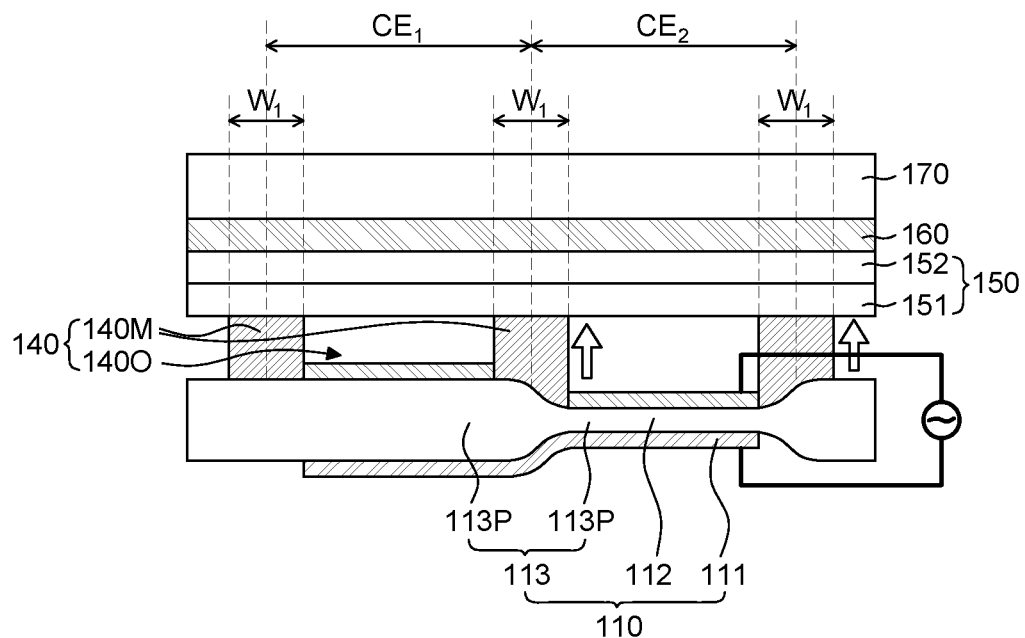
FIG. 4A and FIG. 4B are schematic cross-sectional views provided to explain vibrations of a touch sensitive element included in the display device according to an exemplary embodiment of the present disclosure.
Figure 4B:
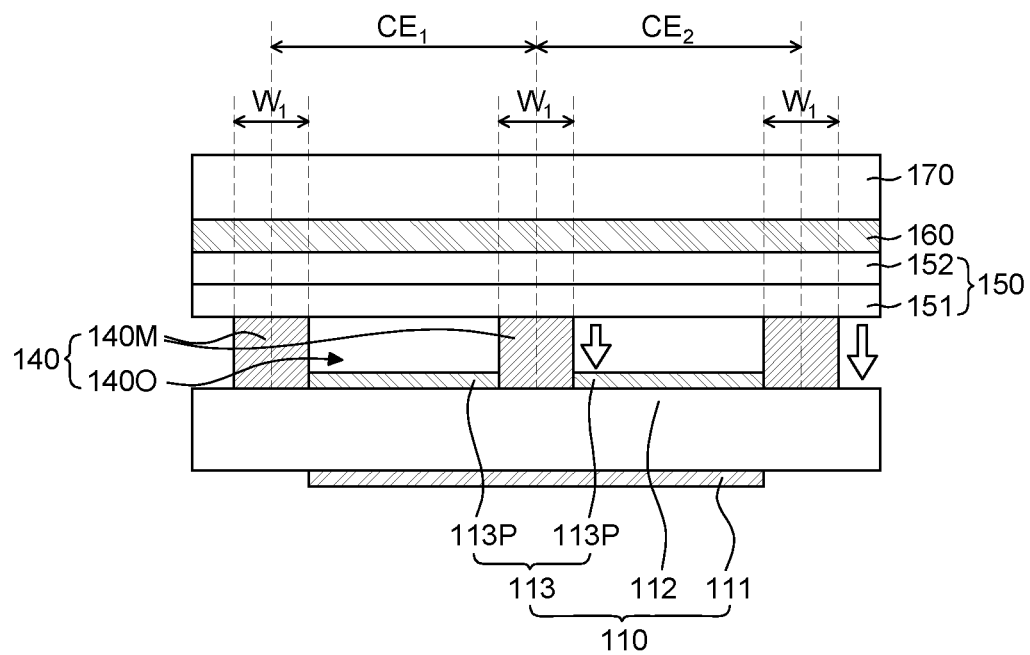

FIG. 4A and FIG. 4B are schematic cross-sectional views provided to explain vibrations of a touch sensitive element included in the display device according to an exemplary embodiment of the present disclosure.

Referring to FIG. 4A, a driving voltage may be applied to a pattern electrode 113P2 and the second electrode layer 111 corresponding to any one haptic cell CE2 of a plurality of pattern electrodes 113P1 and 113P2. For example, a driving voltage may be applied to the second pattern electrode 113P2 and the second electrode layer 111 corresponding to a second haptic cell CE2 in the touch sensitive element 110 including a first haptic cell CE1 and the second haptic cell CE2. In this case, a part of the electro active layer 112 corresponding to an overlapped area between the second pattern electrode 113P2 and the second electrode layer 111 may be contracted based on the driving voltage applied to the second pattern electrode 113P2 and the second electrode layer 111. When a part of the electro active layer 112 is contracted, a part of the electro active layer 112 corresponding to a periphery of the second pattern electrode 113P is relatively expanded. When the electro active layer 112 corresponding to the periphery of the second pattern electrode 113P is expanded, a force is generated from the periphery of the second pattern electrode 113 P2 in an upward direction. Meanwhile, the vibration transfer part 140M is disposed on the periphery of the second pattern electrode 113P2. Thus, the force generated in the upward direction by the expansion of the electro active layer 112 is transferred to the display panel 150 through the vibration transfer part 140M.

Referring to FIG. 4B, when the driving voltage applied between the second pattern electrode 113P2 and the second electrode layer 111 in the second haptic cell CE2 is canceled, the contracted part of the electro active layer 112 corresponding to the overlapped area between the second pattern electrode 113P and the second electrode layer 111 is expanded to its original state. Thus, the expanded part of the electro active layer 112 corresponding to the periphery of the second pattern electrode 113P2 is contracted to its original state. In this case, a force is generated from the periphery of the second pattern electrode 113P2 in a downward direction. The downward force is transferred to the display panel 150 through the vibration transfer part 140M. Thus, a part of the display panel 150 corresponding to the second haptic cell CE2 vibrates up and down.

Meanwhile, the openings 140O provide a displacement space for contraction and expansion of the electro active layer 112. That is, the vibration transfer layer 140 includes the mesh-patterned vibration transfer part 140M, and, thus, a separation space is formed between the pattern electrodes 113P1 and 113P2 and the display panel 150 in the area corresponding to the openings 140O. The electro active layer 112 formed of a dielectric elastomer or relaxor ferroelectric polymer generates vibrations due to a thickness change of the electro active layer 112 caused by contraction and expansion. In this case, the electro active layer 112 can sufficiently vibrate within the separation space. Thus, the thickness of the electro active layer 112 may be greatly changed and the vibration intensity of the electro active layer 112 may be improved.

Further, the vibration transfer layer 140 has a proper stiffness in order to readily transfer vibrations of the electro active layer 112 to the display panel 150. Specifically, the vibration transfer part 140M of the vibration transfer layer 140 has a stiffness higher than that of the electro active layer 112 and lower than that of the display panel 150.

Meanwhile, the stiffness of a body refers to a physical quantity defined by the following Equation 1.

$$K_t = \frac{wtY}{l}$$ [Equation 1]

Herein, w represents the width of the body, t represents the thickness of the body, l represents the length of the body, and Y represents the total Young's modulus of the body. That is, the stiffness of the object is in proportion to the Young's modulus of the body.

Therefore, the fact that the stiffness of the vibration transfer layer 140 is higher than that of the electro active layer 112 and lower than that of the display panel 150 means that the Young's modulus of the vibration transfer layer 140 is higher than that of the electro active layer 112 and lower than that of the display panel 140.

The vibration transfer layer 140 is disposed between the touch sensitive element 110 and the display panel 150 and configured to transfer vibrations of the touch sensitive element 110 to the display panel 150. If the vibration transfer layer 140 is not disposed, the touch sensitive element 110 is in direct contact with the display panel 150 and vibrations of the touch sensitive element 110 is directly transferred to the display panel 150. In general, the electro active layer 112 formed of a dielectric elastomer or relaxor ferroelectric polymer has a very low stiffness due to the characteristics of the material. Thus, there is a big difference in stiffness between the touch sensitive element 110 and the display panel 150. Typically, the stiffness of the display panel 150 is 20 times or higher than that of the electro active layer 112. If a lower surface of the display panel 150 is in direct contact with the touch sensitive element 110, the lower surface of the display panel 150 may limit the displacement space for contraction and expansion of the electro active layer 112. Further, a low stiffness of the electro active layer 112 reduces the blocking force of the touch sensitive element 110. Thus, the touch sensitive element 110 may not vibrate the display panel 150 with a sufficient force and vibrations of the touch sensitive element 110 may not be readily transferred to an upper side of the display panel 150. Herein, the blocking force of the touch sensitive element 110 refers to a maximum force which can be generated by vibration of the touch sensitive element 110 and satisfies the relationship in the following Equation 2.

$$F=K_t \Delta L_0. \quad \text{[Equation 2]}$$

Herein, F represents the magnitude of the blocking force, $K_t$ represents the total stiffness of a vibrating body, and $L_0$ represents a vertical displacement of the vibrating body. The electro active layer 112 formed of a dielectric elastomer or relaxor ferroelectric polymer has a very low stiffness, and, thus, the touch sensitive element 110 has a low blocking force. Therefore, the touch sensitive element 110 may not sufficiently vibrate an upper structure including the display panel 150, the touch element 160, and the cover window 170. Also, there is a big difference in stiffness between the display panel 150 and the touch sensitive element 110. Thus, if the lower surface of the display panel 150 is in direct contact with the touch sensitive element 110, the lower surface of the display panel 150 limits a vertical displacement of the touch sensitive element 110. Therefore, the blocking force of the touch sensitive element 110 may be further decreased.

However, if the vibration transfer layer 140 is disposed on the touch sensitive element 110, the total stiffness of a module in which the touch sensitive element 110 and the vibration transfer layer 140 are combined may be increased due to the stiffness of the vibration transfer layer 140. Thus, the blocking force of the module in which the touch sensitive element 110 and the vibration transfer layer 140 are combined can be increased. Further, the vibration transfer layer 140 includes the plurality of openings 140O corresponding to the pattern electrodes 113P1 and 113P2. Thus, the electro active layer 112 can secure a sufficient vertical displacement space within the openings 140O. Therefore, the total blocking force of the module in which the touch sensitive element 110 and the vibration transfer layer 140 are combined can be increased.

The vibration transfer layer 140 may have a stiffness or Young's modulus higher than that of the electro active layer 112 and lower than that of the display panel 150 to increase the total blocking force of the module in which the touch sensitive element 110 and the vibration transfer layer 140 are combined.

The stiffness or Young's modulus of the vibration transfer layer 140 may have an appropriate value between the stiffness or Young's modulus of the display panel 150 and the stiffness or Young's modulus of the electro active layer 112. For example, the stiffness or Young's modulus of the vibration transfer layer 140 may have a value 10 times to 20 times higher than that of the electro active layer 112. If the stiffness or Young's modulus of the vibration transfer layer 140 is lower than 10 times the stiffness or Young's modulus of the electro active layer 112, the blocking force of the module in which the touch sensitive element 110 and the vibration transfer layer 140 are combined may not be sufficiently increased. Thus, the module in which the touch sensitive element 110 and the vibration transfer layer 140 are combined may not vibrate the upper structure including the display panel 150, the touch element 160, and the cover window 170 with a sufficient force. Meanwhile, if the stiffness or Young's modulus of the vibration transfer layer 140 is higher than 20 times the stiffness or Young's modulus of the electro active layer 112, a vertical displacement of the electro active layer 112 may be excessively limited by the vibration transfer layer 140. As described above, the vertical displacement of the electro active layer 112 is transferred through the vibration transfer part 140M of the vibration transfer layer 140. In this case, the vertical displacement transferred to the vibration transfer part 140M is generated from peripheries of the pattern electrodes 113P1 and 113P2. However, if the stiffness or Young's modulus of the vibration transfer layer 140 is excessively high, a deformation rate of the vibration transfer layer 140 depending on vertical vibrations of the electro active layer 112 may be decreased. That is, a load of the upper structure including the display panel 150, the touch element 160, and the cover window 170 can be transferred to the electro active layer 112 through the vibration transfer layer 140 having a high stiffness or Young's modulus. Also, the vertical displacement of the electro active layer 112 can be limited by the peripheries of the pattern electrodes 113P1 and 113P2. Thus, the blocking force of the module in which the touch sensitive element 110 and the vibration transfer layer 140 are combined can be decreased.

The vibration transfer layer 140 may be formed of various materials having the above-described stiffness or Young's modulus. For example, the vibration transfer layer 140 may be formed of silicon (Si) gel, polycarbonate (PC), polyethylene terephthalate (PET), polyvinyl alcohol (PVA), or a PVDF copolymer. If the vibration transfer layer 140 is formed of the above-described material, the stiffness or Young's modulus of the vibration transfer layer 140 may have a value between the stiffness or Young's modulus of the display panel 150 and the stiffness or Young's modulus of the electro active layer 112. Thus, the blocking force of the module in which the touch sensitive element 110 and the vibration transfer layer 140 are combined can be appropriately increased.

As a result, the display device 100 according to an exemplary embodiment of the present disclosure includes the vibration transfer layer 140 disposed between the display panel 150 having a high stiffness and the touch sensitive element 110 having a low stiffness and having the stiffness between the stiffness of the display panel 150 and the stiffness of the touch sensitive element 110. The vibration transfer layer 140 transfers vibrations of the touch sensitive element 110 to the display panel 150. The vibration transfer layer 140 transfers vibrations of the touch sensitive element 110 to the display panel 150 without limiting a vertical displacement of the touch sensitive element 110. Particularly, the total stiffness of the module in which the touch sensitive element 110 and the vibration transfer layer 140 are combined can be increased due to the stiffness of the vibration transfer layer 140. Further, the blocking force of the module can be increased. Thus, even if the heavy upper structure including the display panel 150, the touch element 160, and the cover window 170 is disposed on the touch sensitive element 110, the touch sensitive element 110 can vibrate the upper structure with a sufficient force.

As a result, the display device 100 according to an exemplary embodiment of the present disclosure has an improved vibration intensity. Specifically, a vibration acceleration of the display device 100 according to Example of the present disclosure including the vibration transfer layer 140 and a vibration acceleration of a display device without the vibration transfer layer 140 according to Comparative Example are given in the following Table 1.

TABLE 1

| Classification | Test 1 | Test 2 |
| --- | --- | --- |
| Comparative Example | 1.4 G | 0.1 G |
| Exemplary Embodiment | 2.5 G | 0.75 G |

In [Table 1], the display device according to Example and the display device according to comparative example include the same components except the vibration transfer layer 140. Specifically, each of the display device 100 according to example and the display device according to comparative example includes the first electrode layer 113 having a thickness of 300 nm and the second electrode layer 111 having a thickness of 300 nm. Both the first electrode layer 113 and the second electrode layer 111 are formed of indium tin oxide (ITO). The first electrode layer 113 and the second electrode layer 111 have a width of 300 mm and a length of 125 mm. Meanwhile, the first electrode layer 113 includes the pattern electrodes 113P having a width of 62.5 mm and a length of 45 mm and includes eight pattern electrodes 113P disposed in four columns and two rows. In this case, a distance between the pattern electrodes 113P is 10 mm. The electro active layer was formed to a thickness of 20 μm using PVDF-TrFE-CFE as one of relaxor ferroelectric polymers.

The display device 100 according to example further includes the vibration transfer layer 140 disposed on the touch sensitive element 110. The vibration transfer layer 140 was formed to a thickness of 200 Jim using polycarbonate.

The result listed in Table 1 was obtained by measuring a vibration acceleration in a state where the cover window 170 having a weight of 10 g was placed on the touch sensitive element (Test 1). Also, the result in Table 1 was obtained by measuring a vibration acceleration in a state where the upper structure having a weight of 320 g and including the cover window 170, the touch element 160, and the display panel 150 was placed on the touch sensitive element (Test 2). Each vibration acceleration was measured by applying a 400 V/100 Hz AC driving voltage to the first electrode layer 113 and the second electrode layer 111.

Referring to Table 1, it can be seen that the display device including the vibration transfer layer 140 according to example is improved in vibration acceleration compared with the display device without the vibration transfer layer 140 according to comparative example. Specifically, in the state where the 320 g upper structure is placed (Test 2), the display device according to comparative example transfers vibrations having a vibration acceleration of 0.1 G and the display device according to example transfers vibrations having a vibration acceleration of 0.75 G.

Meanwhile, the display device 100 according to an exemplary embodiment of the present disclosure includes the mesh-patterned vibration transfer layer 140. Thus, resonance frequencies of the haptic cells CE1 and CE2 may be matched with a frequency of a driving voltage. Details thereof will be described with reference to FIG. 5 and FIG. 6.

Figure 5:
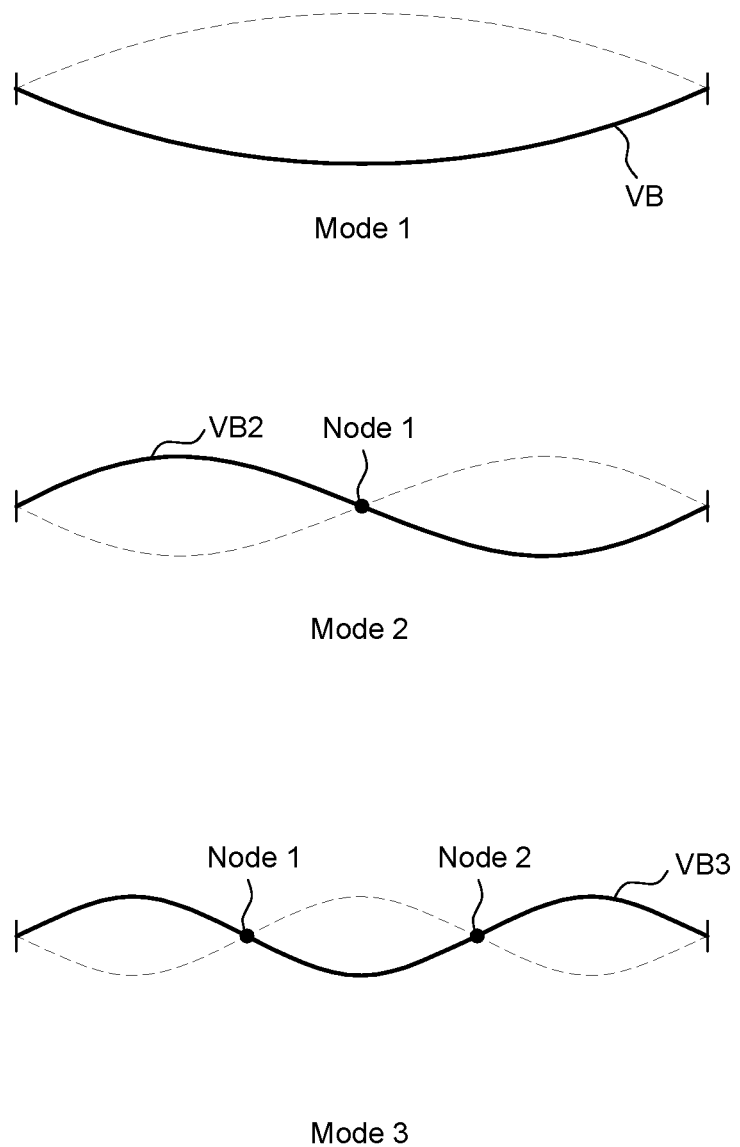
FIG. 5 is a schematic diagram provided to explain a vibration mode of the display device according to an exemplary embodiment of the present disclosure.

FIG. 5 is a schematic diagram provided to explain a vibration mode of the display device according to an exemplary embodiment of the present disclosure. A vibration mode illustrated in FIG. 5 refers to a vibration mode for any one of the plurality of haptic cells CE1 and CE2 of the touch sensitive element 110.

Referring to FIG. 5, each of the plurality of haptic cells CE1 and CE2 of the touch sensitive element 110 vibrates due to contraction and expansion of the electro active layer 112. Therefore, parts of the display device 100 corresponding to the plurality of haptic cells CE1 and CE2 may vibrate in various vibration modes along with vibration of the electro active layer 112. FIG. 5 illustrates a first vibration mode Mode 1, a second vibration mode Mode 2, and a third vibration mode Mode 3 of vibrating bodies VB1, VB2, and VB3, respectively, and the vibrating bodies VB1, VB2, and VB3 correspond to any one of the plurality of haptic cells CE1 and CE2 of the display device 100.

A vibration mode of the vibrating bodies VB1, VB2, and VB3 is determined depending on a vibration frequency of the vibrating bodies VB1, VB2, and VB3 and a resonant frequency of the vibrating bodies VB1, VB2, and VB3. For example, a vibration frequency of the vibrating body VB1 corresponds to a first resonant frequency, the vibrating body VB1 vibrates in the first vibration mode Mode 1. Further, if a vibration frequency of the vibrating body VB2 corresponds to a second resonant frequency, the vibrating body VB2 vibrates in the second vibration mode Mode 2. Furthermore, if a vibration frequency of the vibrating body VB3 corresponds to a third resonant frequency, the vibrating body VB3 vibrates in the third vibration mode 3.

The vibrating body VB1 vibrating in the first vibration mode Mode 1 does not include a node that refers to a non-vibrating part and all parts of the vibrating body VB1 vibrate up and down. The vibrating body VB2 vibrating in the second vibration mode Mode 2 includes a single node Node 1 and vibrates symmetrically with respect to the node Node 1. However, apart corresponding to the node Node 1 of the vibrating body VB2 does not vibrate and the vibrating body VB2 includes a non-vibrating part. The vibrating body VB3 vibrating in the third vibration mode Mode 3 includes two nodes Node 1 and Node 2 and vibrates symmetrically with respect to the two nodes Node 1 and Node 2. Thus, the vibrating body VB3 includes two non-vibrating parts. If a driving voltage applied to the touch sensitive element 110 has a frequency corresponding to the second resonant frequency of the display device 100, a haptic cell applied with the driving voltage may vibrate in the second vibration mode Mode 2. In this case, the haptic cell includes a single node Node 1 and includes a non-vibrating part. Further, if a driving voltage applied to the touch sensitive element 110 has a frequency corresponding to the third resonant frequency of the display device 100, a haptic cell applied with the driving voltage may vibrate in the third vibration mode Mode 3. In this case, the haptic cell includes two nodes Node 1 and Node 2 and includes two non-vibrating parts.

The resonant frequencies of the vibrating bodies VB1, VB2, and VB3 are determined by unique properties of the vibrating bodies VB1, VB2, and VB3 and defined by the following Equation 3 through Equation 5.

$$f_1 = \frac{3.516}{2\pi L^2}\sqrt{\frac{YI}{m}} \qquad \text{[Equation 3]}$$

$$f_2 = \frac{22.03}{2\pi L^2}\sqrt{\frac{YI}{m}} \qquad \text{[Equation 4]}$$

$$f_3 = \frac{61.7}{2\pi L^2}\sqrt{\frac{YI}{m}} \qquad \text{[Equation 5]}$$

Specifically, [Equation 3] relates to the first resonant frequency, [Equation 4] relates to the second resonant frequency, and [Equation 5] relates to the third resonant frequency. Further, Y represents the Young's modulus of the vibrating bodies VB1, VB2, and VB3, m represents the total mass of the vibrating bodies VB1, VB2, and VB3, and I represent the area moment of inertia of the vibrating bodies VB1, VB2, and VB3. Furthermore, L represents the length of the vibrating bodies VB1, VB2, and VB3.

The vibration transfer layer 140 includes the mesh-patterned vibration transfer part 140M. Thus, the Young's modulus, the total mass, and the area moment of inertia of the haptic cells of the display device 100 may be changed. Particularly, since the area moment of inertia is determined depending on a shape of a vibrating body, the area moment of inertia of a haptic cell may be changed depending on the width W1 and the thickness of the vibration transfer part 140M. A resonant frequency of the haptic cell may be changed. The first resonant frequency of the display device 100 according to an exemplary embodiment of the present disclosure corresponds to a frequency of a driving voltage to be applied to the touch sensitive element 110. For example, if a 400 V/100 Hz driving voltage is applied to the touch sensitive element 110, the first resonant frequency of the display device 100 may correspond to 100 Hz. In this case, the display device 100 vibrates in the first vibration mode Mode 1 and a haptic cell of the display device 100 does not include a node. Therefore, the display device 100 may not include a non-vibrating part. Thus, the user can feel vibrations at any spot within the haptic cell and more effective haptic feedback can be provided. In this case, the width W1 and the thickness of the mesh pattern of the vibration transfer layer 140 may be determined in order for the first resonant frequency of the display device 100 to correspond to the frequency of the driving voltage.

Figure 6:
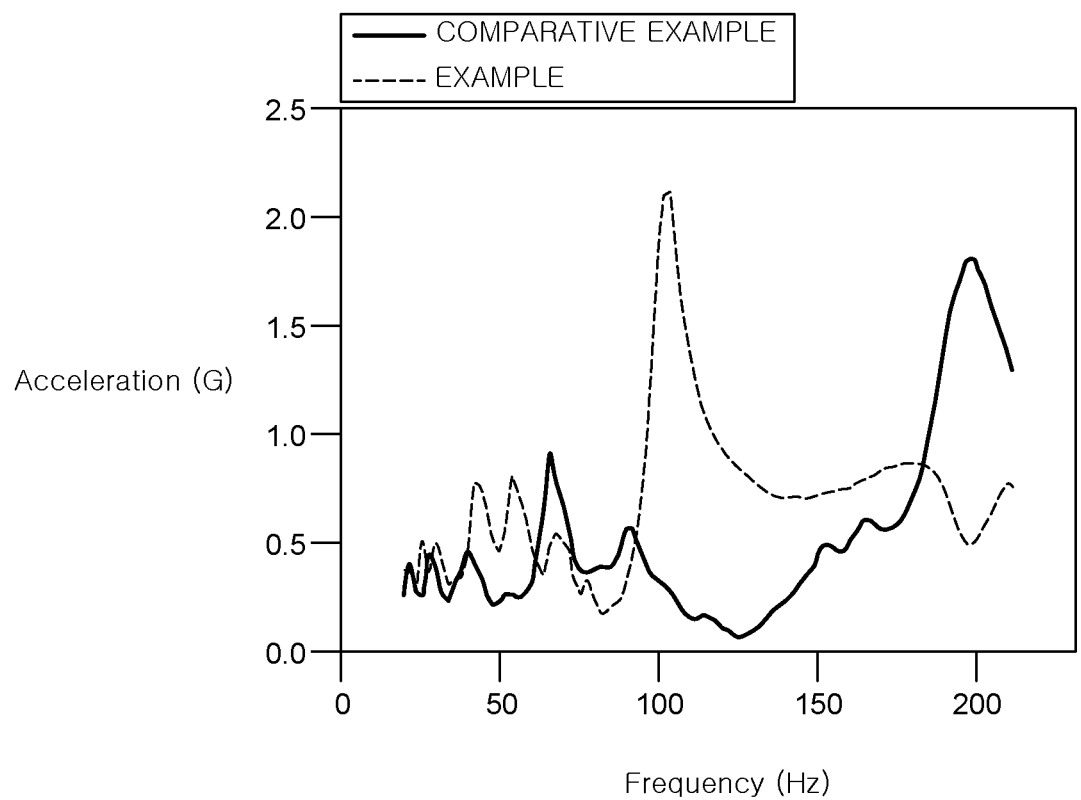
FIG. 6 is a graph provided to explain a changed resonant frequency of the display device according to an exemplary embodiment of the present disclosure.

FIG. 6 is a graph provided to explain a changed resonant frequency of the display device according to an exemplary embodiment of the present disclosure. In FIG. 6, a display device according to comparative example and a display device according to example include the same components except the vibration transfer layer 140. Specifically, the display device according to comparative example and the display device 100 according to example have the same configurations as the display device according to comparative example and the display device 100 according to example, respectively, as listed in Table 1. Meanwhile, in the display device 100 according to example, the vibration transfer layer 140 was formed to a thickness of 200 μm using polycarbonate, and the width W1 of the vibration transfer part 140M of the vibration transfer layer 140 was 10 mm. The graph of FIG. 6 was measured by applying a driving voltage of 400 V to each touch sensitive element 110 of the display device according to comparative example and the display device 100 according to example.

Referring to FIG. 6, the display device according to comparative example vibrated with a high vibration acceleration when a driving voltage having a frequency of 200 Hz is applied, and vibrated in the first vibration mode. The display device 100 according to example vibrated with a high vibration acceleration when a driving voltage having a frequency of 100 Hz is applied, and vibrated in the first vibration mode. Therefore, it can be seen that the first resonant frequency of the display device according to comparative example is around 200 Hz and the first resonant frequency of the display device 100 according to example is around 100 Hz. The display device 100 according to example further includes the vibration transfer layer 140 compared with the display device according to comparative example. Thus, it can be seen that the first resonant frequency of the display device 100 according to example was shifted from 200 Hz to 100 Hz due to the vibration transfer layer 140. If a 400 V/100 Hz driving voltage is applied to the touch sensitive element 110, the display device 100 according to example may vibrate in the first vibration mode. However, the display device according to comparative example may vibrate in another vibration mode instead of the first vibration mode or may not produce resonance. That is, since the vibration transfer layer 140 was disposed between the touch sensitive element 110 and the display panel 150, the first resonant frequency of the display device 100 was changed so as to correspond to the frequency of the driving voltage. Further, the vibration transfer layer 140 caused resonance of the display device 100, and, thus, vibrations with a high vibration acceleration was implemented.

Meanwhile, in the display device 100 according to an exemplary embodiment of the present disclosure, the touch sensitive element 110 is disposed under the display panel 150. Thus, a decrease in visibility caused by the touch sensitive element 110 may not occur. If the touch sensitive element 110 is disposed on the display panel 150 configured to display an image, the visibility of the display panel may be decreased due to the touch sensitive element 110. The first electrode layer 113 and the second electrode layer 111 of the touch sensitive element 110 may be formed of transparent conductive materials. However, although the first electrode layer 113 and the second electrode layer 111 are formed of transparent conductive materials, a part of light incident into the first electrode layer 113 and the second electrode layer 111 may be reflected or scattered by the first electrode layer 113 and the second electrode layer 111. Therefore, a part of the light incident into the first electrode layer 113 and the second electrode layer 111 may not pass through the first electrode layer 113 and the second electrode layer 111. Thus, the transmittance of the touch sensitive element 110 may be decreased due to the first electrode layer 113 and the second electrode layer 111. However, the touch sensitive element 110 according to an exemplary embodiment of the present disclosure is disposed under the display panel 150. Thus, light is not reflected or scattered by the first electrode layer 113 and the second electrode layer 111 of the touch sensitive element 110. Accordingly, a decrease in visibility of the display device 100 may not occur.

Figure 7:
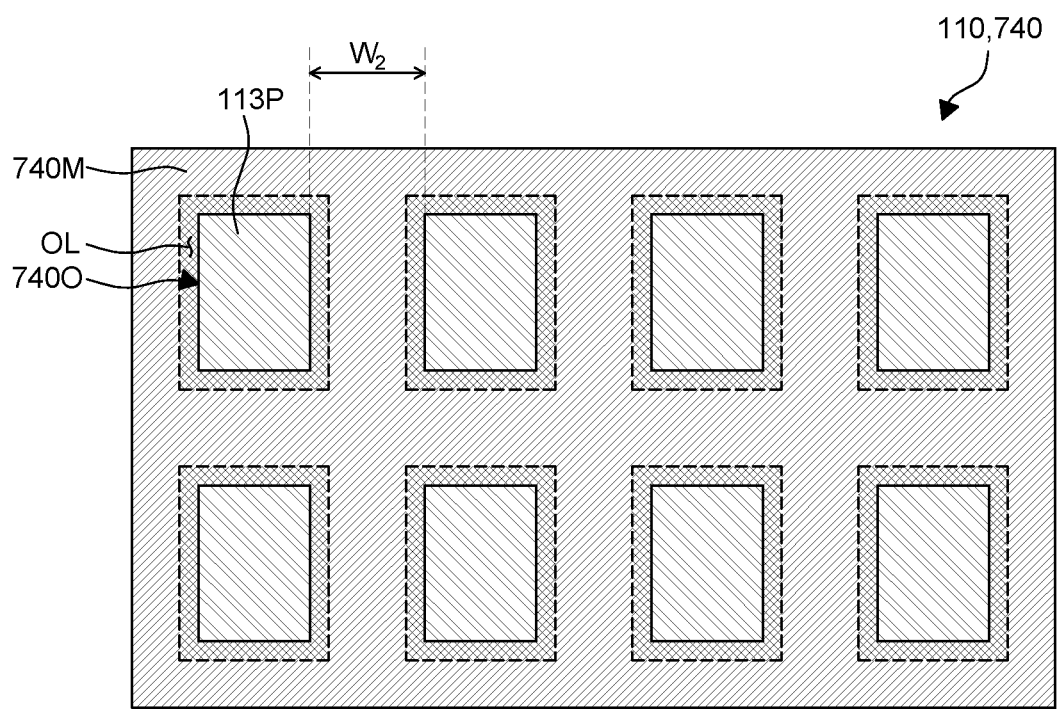
FIG. 7 is a schematic plan view of a vibration transfer layer and a plurality of pattern electrodes of a display device according to another exemplary embodiment of the present disclosure.

FIG. 7 is a schematic plan view of a vibration transfer layer and a plurality of pattern electrodes of a display device according to another exemplary embodiment of the present disclosure. The display device according to another exemplary embodiment of the present disclosure is the same as the display device 100 according to an exemplary embodiment of the present disclosure illustrated in FIG. 1 through FIG. 3 except that a part of a vibration transfer part 740M of a vibration transfer layer 740 is overlapped with the plurality of pattern electrodes 113P of the touch sensitive element 110. Therefore, the redundant description thereof will be omitted.

Referring to FIG. 7, the vibration transfer part 740M of the vibration transfer layer 740 has a width W2 greater than the distance between the pattern electrodes 113P. Thus, a part of the pattern electrode 113P and a part of the vibration transfer part 740M are overlapped with each other and an overlapped area OL is formed. Further, the area of each opening 740O of the vibration transfer layer 740 is smaller than the area of each pattern electrode 113P. Since a part of the pattern electrode 113P and a part of the vibration transfer part 740M are overlapped with each other, the vibration transfer part 740M in the overlapped area OL is in contact with the pattern electrodes 1130P.

As described above, the width W2 and the thickness of the vibration transfer part 740M affect the area moment of inertia of the entire display device. Thus, the resonant frequencies of the entire display device can be regulated. Therefore, the display device according to another exemplary embodiment of the present disclosure illustrated in FIG. 7 and the display device according to an exemplary embodiment of the present disclosure illustrated in FIG. 1 through FIG. 3 may have different resonant frequencies from each other. Further, as the width W2 of the vibration transfer part 740M is increased, the contact area between the vibration transfer layer 740 and the touch sensitive element 110 may be increased. Thus, the adhesion between the touch sensitive element 110 and the display panel can be improved.

Meanwhile, since the vibration transfer part 740M is partially overlapped with the pattern electrode 113P, the vibration intensity of the display device 100 may be slightly decreased compared with a case where the vibration transfer part 740M is not overlapped with the pattern electrode 113P. Details thereof will be described with reference to FIG. 8.

Figure 8:
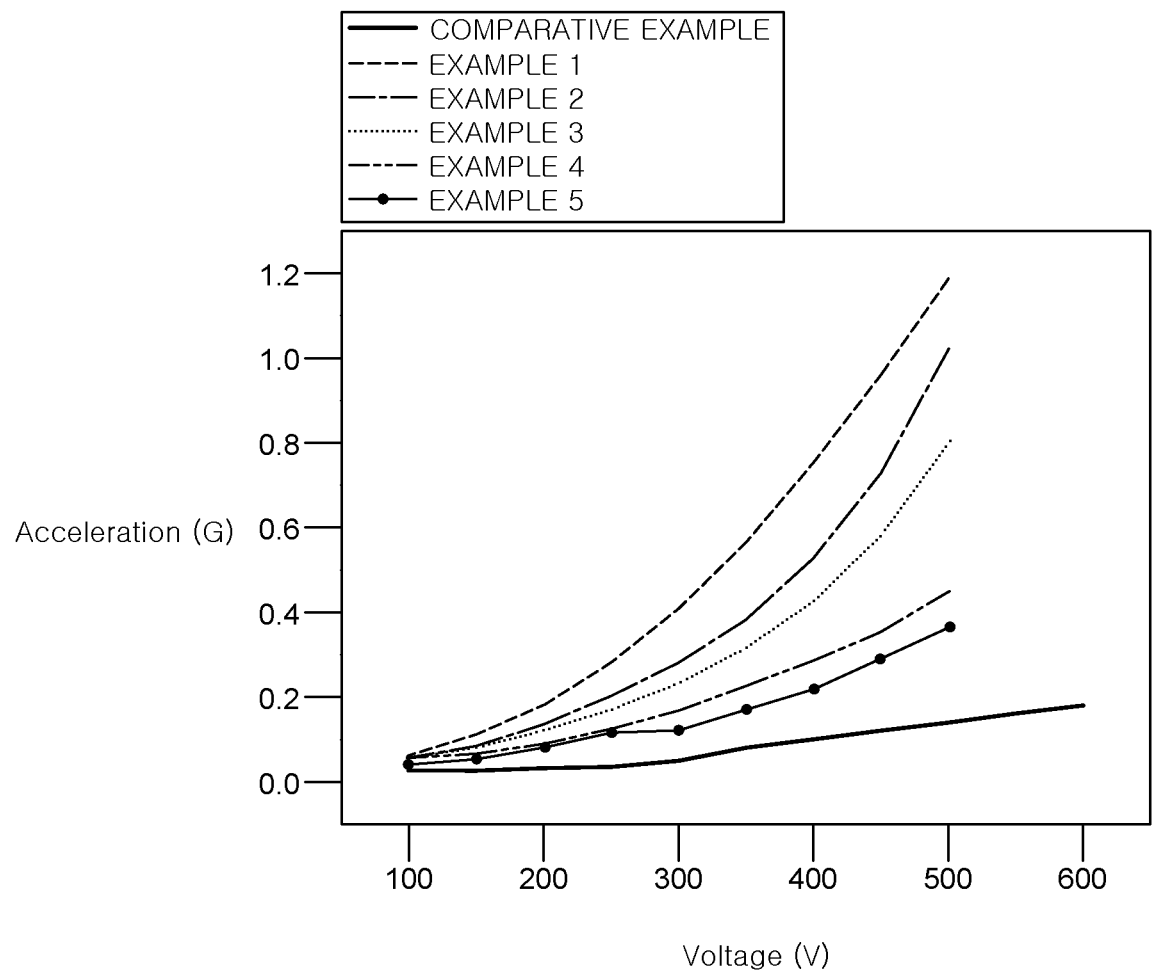
FIG. 8 is a graph provided to explain improved vibration intensities of display devices according to various exemplary embodiments of the present disclosure.

FIG. 8 is a graph provided to explain improved vibration intensities of display devices according to various exemplary embodiments of the present disclosure. In FIG. 8, a display device according to Comparative Example does not include a vibration transfer layer. Meanwhile, each of display devices according to Example 1 through Example 5 includes a vibration transfer layer. The display device according to Comparative Example and the display devices according to Example 1 through Example 5 include the same components except the vibration transfer layer. The display device according to Comparative Example and the display devices according to Example 1 through Example 5 have the same configurations as the display device according to Comparative Example and the display device according to Example, respectively, as listed in Table 1. Therefore, the redundant description thereof will be omitted.

The display device according to Example 1 includes the vibration transfer layer 140 illustrated in FIG. 1 through FIG. 3. That is, the vibration transfer layer 140 in Example 1 includes the vibration transfer part 140M having the boundary line matching the boundary lines of the pattern electrodes 113P and the vibration transfer part 140M is not overlapped with the pattern electrodes 113P. In Example 1, the area of each opening 140O of the vibration transfer layer 140 matches the area of each pattern electrode 113P. However, in Example 2 through Example 5, the vibration transfer layer 740 is partially overlapped with the pattern electrodes 113P. That is, the width W2 of the vibration transfer part 740M is greater than the distance between the pattern electrodes 113P and the vibration transfer part 740M is in contact with the pattern electrodes 113P in the overlapped area OL. Specifically, in Example 2, the area of the overlapped area OL where the vibration transfer part 740M is in contact with the pattern electrodes 113P was 14.7% of the total area of the pattern electrodes 113P. That is, in Example 2, the area of the openings 740O was 85.3% of the area of the pattern electrodes 113P. In Example 3, the area of the overlapped area OL where the vibration transfer part 740M is in contact with the pattern electrodes 113P was 22% of the total area of the pattern electrodes 113P. That is, in Example 3, the area of the openings 740O was 78% of the area of the pattern electrodes 113P. In Example 4, the area of the overlapped area OL where the vibration transfer part 740M is in contact with the pattern electrodes 113P was 38% of the total area of the pattern electrodes 113P. That is, in Example 4, the area of the openings 740O was 62% of the area of the pattern electrodes 113P. In Example 5, the area of the overlapped area OL where the vibration transfer part 740M is in contact with the pattern electrodes 113P was 50% of the total area of the pattern electrodes 113P. That is, in Example 5, the area of the openings 740O was 50% of the area of the pattern electrodes 113P.

Referring to FIG. 8, it can be seen that the display devices including the vibration transfer layer according to Example 1 through Example 5 are improved in vibration acceleration compared with the display device without the vibration transfer layer according to Comparative Example. Meanwhile, as the area of the overlapped area OL where the vibration transfer part 740M is in contact with the pattern electrodes 113P is increased, the vibration acceleration of the display device can be slightly decreased. That is, the highest vibration acceleration was measured from the display device 100 in which the vibration transfer part 140M is not in contact with the pattern electrodes 113P according to Example 1. Further, as the area of the overlapped area OL where the vibration transfer part 740M is in contact with the pattern electrodes 113P was increased, the vibration acceleration tended to decrease.

As the area of the overlapped area OL where the vibration transfer part 740M is in contact with the pattern electrodes 113P is increased, the area of the openings 740O is decreased. As described above, the openings 740O provide a displacement space for contraction and expansion of the electro active layer 112. Therefore, if the area of the openings 740O is decreased, the displacement space for contraction and expansion of the electro active layer 112 is also decreased. In this case, the blocking force defined by Equation 2 may also be decreased, and the touch sensitive element 110 may not vibrate with a great force. The vibration intensity of the display device is decreased accordingly. However, as described above, when the width W2 of the vibration transfer part 740M is changed, the area moment of inertia of the entire display device may be changed. Also, the resonant frequencies of the display device defined by Equation 3 through Equation 5 may be changed.

As a result, in the display device according to another exemplary embodiment of the present disclosure, the width W2 of the mesh pattern of the vibration transfer layer 740 may be changed so as to regulate the resonant frequencies of the display device as far as the vibration intensity of the display device is not excessively decreased. For example, the width W2 of the vibration transfer part 740M may be regulated as far as the area of the overlapped area OL is in the range of 25% or less and preferably 0% to 25% of the total area of the pattern electrodes 113P. In this case, the area of the openings 740O of the vibration transfer layer 740 may be 100% to 75% of the area of the pattern electrodes 113P. If the area of the overlapped area OL is 0% (i.e., if the area of the openings 740O is 100% of the area of the pattern electrodes 113P), a boundary line of the vibration transfer part 740M matches boundary lines of the pattern electrodes 113P. Further, the vibration transfer part 740M is not overlapped with the pattern electrodes 113P. In this case, the vibration acceleration of the display device can be maximized, but it may be difficult to control the resonant frequencies of the display device. If the area of the overlapped area OL is greater than 25% (i.e., if the area of the openings 740O is smaller than 75% of the area of the pattern electrodes 113P), the vibration intensity of the display device may be excessively decreased as illustrated in Example 4 and Example 5 of FIG. 8. Although the display devices of Example 4 and Example 5 are improved in vibration intensity compared with the display device without the vibration transfer layer 740 according to Comparative Example, the vibration intensity may not be sufficiently improved by the vibration transfer layer 740.

Figure 9:
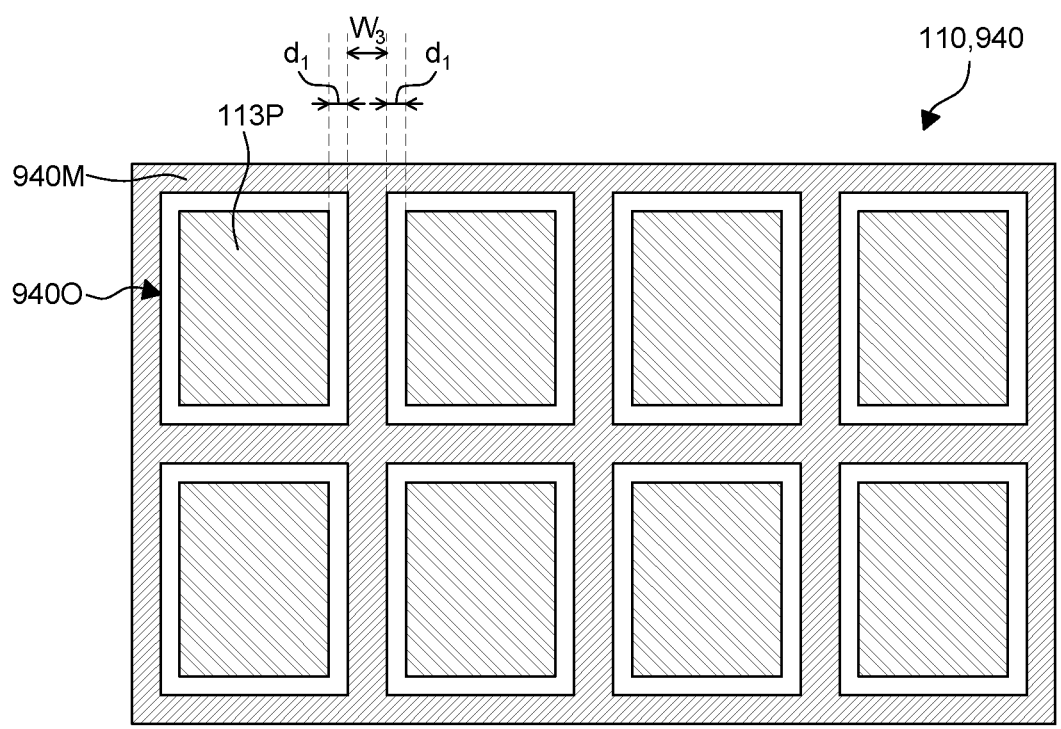
FIG. 9 is a schematic plan view of a vibration transfer layer and a plurality of pattern electrodes of a display device according to yet another exemplary embodiment of the present disclosure.

FIG. 9 is a schematic plan view of a vibration transfer layer and a plurality of pattern electrodes of a display device according to yet another exemplary embodiment of the present disclosure. The display device according to yet another exemplary embodiment of the present disclosure is the same as the display device 100 according to an exemplary embodiment of the present disclosure illustrated in FIG. 1 through FIG. 3 except that a boundary line of a vibration transfer part 940M of a vibration transfer layer 940 is separated from boundary lines of the plurality of pattern electrodes 113P of the touch sensitive element 110. Therefore, the redundant description thereof will be omitted.

Referring to FIG. 9, the vibration transfer part 940M of the vibration transfer layer 940 has a width W3 smaller than the distance between the pattern electrodes 113P. Thus, a boundary line of the vibration transfer part 940M is separated from boundary lines of the pattern electrode 113P adjacent to the boundary line of the vibration transfer part 940M. Further, the area of each opening 940O of the vibration transfer layer 940 is greater than the area of each pattern electrode 113P. Thus, boundary lines of a plurality of openings 940O are separated from boundary lines of the pattern electrodes 113P respectively corresponding to the openings 940O. Herein, a distance between a boundary line of each opening 940O and a boundary line of each pattern electrode 113P corresponding to the opening 940O is defined as a separation distance d1.

As described above, the width W3 and the thickness of the vibration transfer part 940M affect the area moment of inertia of the entire display device. Thus, the resonant frequencies of the entire display device can be regulated by regulating the width W3 of the vibration transfer part 940M. Therefore, the display device according to yet another exemplary embodiment of the present disclosure illustrated in FIG. 9 and the display device according to an exemplary embodiment of the present disclosure illustrated in FIG. 1 through FIG. 3 may have different resonant frequencies from each other.

Further, since the boundary line of the vibration transfer part 940M is separated from the boundary lines of the pattern electrodes 113P, the vibration intensity of the display device 100 may be increased compared with a case where the boundary line of the vibration transfer part 940M matches the boundary lines of the pattern electrodes 113P. Details thereof will be described with reference to FIG. 10.

Figure 10:
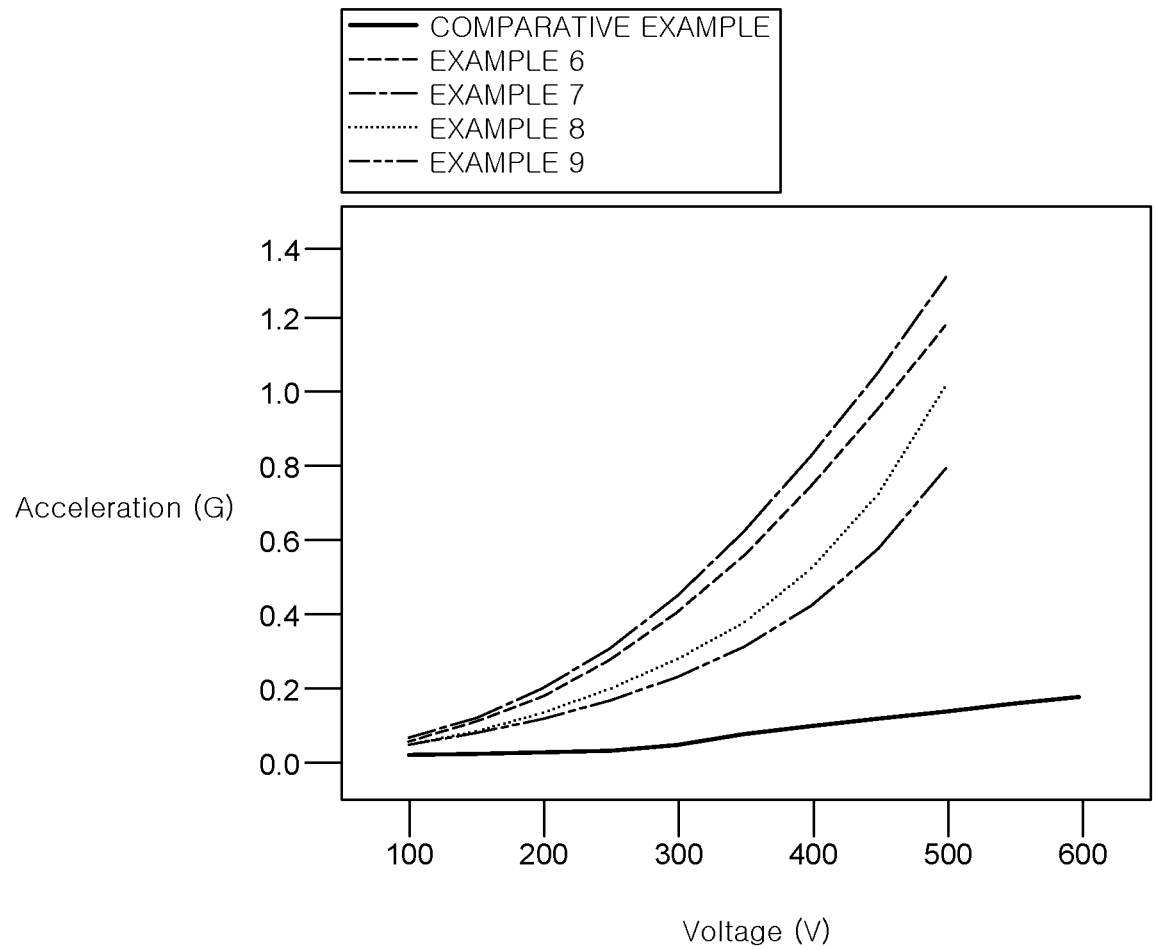
FIG. 10 is a graph provided to explain improved vibration intensities of display devices according to various exemplary embodiments of the present disclosure.

FIG. 10 is a graph provided to explain improved vibration intensities of display devices according to various exemplary embodiments of the present disclosure. In FIG. 10, a display device according to Comparative Example does not include a vibration transfer layer. Meanwhile, each of display devices according to Example 6 through Example 9 includes a vibration transfer layer. The display device according to Comparative Example and the display devices according to Example 6 through Example 9 include the same components except the vibration transfer layer. The display device according to Comparative Example and the display devices according to Example 6 through Example 9 have the same configurations as the display device according to Comparative Example and the display device according to Example, respectively, as listed in Table 1. Therefore, the redundant description thereof will be omitted.

The display device according to Example 6 includes the vibration transfer layer 140 illustrated in FIG. 1 through FIG. 3. That is, the vibration transfer layer 140 in Example 6 includes the vibration transfer part 140M having the boundary line matching the boundary lines of the pattern electrodes 113P and the vibration transfer part 140M is not separated from the boundary lines of the pattern electrodes 113P. In Example 6, boundary lines of the openings 140O of the vibration transfer layer 140 match the boundary lines of the pattern electrodes 113P respectively corresponding to the openings 140O. However, in Example 7 through Example 9, the boundary line of the vibration transfer layer 940 is separated from the boundary lines of the pattern electrodes 113P. That is, the width W3 of the vibration transfer part 940M is smaller than the distance between the pattern electrodes 113P. Specifically, in Example 7, the separation distance d1 between the boundary line of the vibration transfer part 940M and the boundary lines of the pattern electrodes 113P was 1 mm. In Example 8, the separation distance d1 between the boundary line of the vibration transfer part 940M and the boundary lines of the pattern electrodes 113P was 2.5 mm. In Example 9, the separation distance d1 between the boundary line of the vibration transfer part 940M and the boundary lines of the pattern electrodes 113P was 4 mm.

Referring to FIG. 10, it can be seen that the display devices including the vibration transfer layer according to Example 6 through Example 9 are improved in vibration acceleration compared with the display device without the vibration transfer layer according to Comparative Example. Meanwhile, as the boundary line of the vibration transfer part 940M was separated from the boundary lines of the pattern electrodes 113P, the vibration acceleration of the display device was increased and then decreased. That is, the highest vibration acceleration was measured from the display device having the separation distance d1 of 1 mm according to Example 7. When the separation distance d1 was longer than 1 mm, the vibration acceleration of the display device tended to decrease again.

When the separation distance d1 is increased, the width W3 of the vibration transfer part 940M may be that much decreased and the area of each opening 940O may be relatively increased. As described above, the openings 940O provide a displacement space for contraction and expansion of the electro active layer 112. Therefore, as the area of the openings 940O is increased, the vertical displacement of the electro active layer 112 may be increased. Thus, the blocking force defined by Equation 1 may be increased and the vibration acceleration of the display device may be increased. Meanwhile, when the separation distance d1 was longer than 1 mm, the width W3 of the vibration transfer part 940M may be excessively decreased. Vibrations of the electro active layer 112 are transferred to an upper side through the vibration transfer part 940M and the stiffness of the vibration transfer part 940M is affected by the width W3 of the vibration transfer part 940M as exhibited in Equation 2. Therefore, if the width W3 of the vibration transfer part 940M is excessively decreased, the stiffness of the vibration transfer part 940M is decreased. Further, the blocking force of the module in which the vibration transfer layer 940 and the touch sensitive element 110 are combined may be decreased. Thus, the vibration acceleration of the display device is decreased.

As a result, the separation distance d1 between the boundary line of the vibration transfer part 940M and the boundary lines of the pattern electrodes 113P may be regulated so as to change the resonant frequencies of the display device as far as the blocking force is not decreased. For example, the separation distance d1 may have a length appropriately selected from the range of 0 mm to 1 mm. As described above, if the separation distance d1 is longer than 1 mm, the width W3 of the vibration transfer part 940M is excessively decreased. Further, the blocking force of the module in which the vibration transfer layer 940 and the touch sensitive element 110 are combined may be decreased. Therefore, it is not preferable.

The exemplary embodiments of the present disclosure can also be described as follows:

According to an aspect of the present disclosure, there is provided a display device. The display device includes a display panel, a vibration transfer layer, and a touch sensitive element. The vibration transfer layer is disposed under the display panel and has a mesh pattern. The touch sensitive element is disposed under the vibration transfer layer. The display device according to an exemplary embodiment of the present disclosure includes the vibration transfer layer having a mesh pattern between the display panel and the touch sensitive element. Thus, a displacement space for contraction and expansion of the touch sensitive element is not limited, and vibrations of the touch sensitive element can be easily transferred to an upper side of the display panel.

The touch sensitive element includes an electro active layer and a plurality of pattern electrodes separated from each other on one surface of the electro active layer. The vibration transfer layer may be in contact with the electro active layer between the plurality of pattern electrodes.

The stiffness of the vibration transfer layer may be higher than that of the electro active layer and lower than that of the display panel.

The stiffness of the vibration transfer layer may be 10 times to 20 times higher than that of the electro active layer.

The vibration transfer layer may be partially in contact with the plurality of pattern electrodes.

The area of an overlapped area where the vibration transfer layer is in contact with the plurality of pattern electrodes may be 25% or less of the total area of the plurality of pattern electrodes.

A boundary line of the vibration transfer layer may match boundary lines of the plurality of pattern electrodes or may be separated from the boundary lines of the plurality of pattern electrodes.

A separation distance between the boundary line of the vibration transfer layer and the boundary lines of the pattern electrodes adjacent to the boundary line of the vibration transfer layer is shorter than 1 mm.

The electro active layer may be formed of an electro active polymer formed of a PVDF terpolymer or a silicon (Si)-based, polyurethane (PU)-based or acryl-based dielectric elastomer.

The vibration transfer layer may be formed of silicon (Si) gel, polycarbonate (PC), polyethylene terephthalate (PET), polyvinyl alcohol (PVA), or a PVDF copolymer.

A first resonant frequency of the display device may correspond to a frequency of a driving voltage to be applied to the touch sensitive element.

According to another aspect of the present disclosure, there is provided a display device. The display device includes a touch sensitive element, a vibration transfer layer on the touch sensitive element, and a display panel on the vibration transfer layer. The touch sensitive element includes an electro active layer, a first electrode layer on one surface of the electro active layer, the first electrode layer including a plurality of pattern electrodes, and a second electrode layer on the other surface of the electro active layer. The vibration transfer layer includes a plurality of openings corresponding to the plurality of pattern electrodes. The display device according to another exemplary embodiment of the present disclosure includes the vibration transfer layer including the plurality of openings. The electro active layer of the touch sensitive element can contract and expand in a vertical direction within the plurality of openings of the vibration transfer layer. Thus, the blocking force of the touch sensitive element can be improved and the vibration intensity of a module in which the vibration transfer layer and the touch sensitive element are combined can be improved.

The Young's modulus of the vibration transfer layer may be higher than that of the electro active layer and lower than that of the display panel.

The Young's modulus of the vibration transfer layer may be 10 times to 20 times higher than that of the electro active layer.

The area of each of the plurality of openings may be smaller than or equal to the area of each of the plurality of pattern electrodes.

The area of each of the plurality of openings may be 75% or more of the area of each of the plurality of pattern electrodes.

Boundary lines of the plurality of openings may match boundary lines of the plurality of pattern electrodes respectively corresponding to the plurality of openings or may be separated from the boundary lines of the plurality of pattern electrodes respectively corresponding to the plurality of openings.

If a driving voltage is applied to the touch sensitive element, haptic cells respectively corresponding to the plurality of pattern electrodes may be configured to vibrate in a first vibration mode.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
   a display panel;
   a vibration element under the display panel, the vibration element including an electro active layer that is configured to vibrate responsive to an application of voltage to the electro active layer; and
   a vibration transfer layer between the display panel and the vibration element, wherein at least a portion of the vibration transfer layer is in contact with the display panel such that the portion of the vibration transfer layer overlaps a display area of the display panel, and the portion of the vibration transfer layer overlaps a portion of the electro active layer that is overlapped by the display area;
   wherein the vibration transfer layer comprises a plurality of openings, and the vibration transfer layer configured to transmit the vibration generated by the electro active layer to the display panel.

2. The display device according to claim 1, wherein the vibration element further comprises:
a plurality of first electrodes on a first surface of the electro active layer, each of the plurality of first electrodes separated from each other; and
a second electrode on a second surface of the electro active layer that is opposite the first surface,
wherein the vibration transfer layer is in contact with the electro active layer; and
wherein the electro active layer is configured to vibrate responsive to the voltage creating a voltage difference between at least one of the plurality of first electrodes and the second electrode.

3. The display device according to claim 2, wherein the vibration transfer layer is stiffer than the electro active layer, and the display panel is stiffer than the vibration transfer layer.

4. The display device according to claim 3, wherein a stiffness of the vibration transfer layer is 10 times to 20 times greater than a stiffness of the electro active layer.

5. The display device according to claim 2, wherein the vibration transfer layer is partially in contact with the plurality of first electrodes.

6. The display device according to claim 5, wherein an area of the vibration transfer layer that is in contact with the plurality of first electrodes is at most 25% of a total area of the plurality of first electrodes.

7. The display device according to claim 2, wherein a size of the plurality of openings of the vibration transfer layer matches a size of the plurality of first electrodes or a size of the plurality of openings of the vibration transfer layer is larger than a size of the plurality of first electrode.

8. The display device according to claim 7, wherein a separation distance between the vibration transfer layer and each of the plurality of first electrodes is less than 1 mm.

9. The display device according to claim 2, wherein the electro active layer is formed of an electro active polymer formed of a PVDF terpolymer or a silicon (Si)-based, polyurethane (PU)-based or acryl-based dielectric elastomer.

10. The display device according to claim 1, wherein the vibration transfer layer is formed of silicon (Si) gel, polycarbonate (PC), polyethylene terephthalate (PET), polyvinyl alcohol (PVA), or a PVDF copolymer.

11. The display device according to claim 1, wherein a resonant frequency of the display device corresponds to a frequency of the voltage to be applied to the vibration element.

12. The display device according to claim 2, wherein at least one of the plurality of openings is quadrilateral in shape and at least one of the plurality of first electrodes that corresponds to the at least one of the plurality of first openings is quadrilateral in shape.

13. A display device comprising:
a display panel;
a vibration element under the display panel, the vibration element comprising:
an electro active layer;
a plurality of first electrodes on a first surface of the electro active layer, the plurality of first electrodes separated from each other; and
a second electrode on a second surface of the electro active layer that is opposite the first surface, the second electrode overlapped by the plurality of first electrodes on the first surface,
wherein the electroactive layer is configured to vibrate responsive to applying a voltage to the electroactive layer based on a voltage difference between the second electrode and at least one of the plurality of first electrodes; and
a vibration transfer layer between the display panel and the vibration element, wherein at least a portion of the vibration transfer layer is in contact with the display panel such that the portion of the vibration transfer layer overlaps a display area of the display panel, and the portion of the vibration transfer layer overlaps a portion of the electro active layer that is overlapped by the display area;
wherein the vibration transfer layer comprising a plurality of openings that each correspond to one of the plurality of first electrodes, the vibration transfer layer configured to transmit the vibration generated by the electro active layer to the display panel.

14. The display device according to claim 13, wherein a Young's modulus of the vibration transfer layer is greater than Young's modulus of the electro active layer and the Young's modulus of the vibration transfer layer is less than the Young's modulus of the display panel.

15. The display device according to claim 14, wherein the Young's modulus of the vibration transfer layer is 10 times to 20 times greater than the Young's modulus of the electro active layer.

16. The display device according to claim 13, wherein an area of each of the plurality of openings is less than or equal to an area of each of the plurality of first electrodes.

17. The display device according to claim 16, wherein the area of each of the plurality of openings is 75% or more of the area of each of the plurality of first electrodes.

18. The display device according to claim 13, wherein a size of the plurality of openings of the vibration transfer layer matches a size of the plurality of first electrodes or a size of the plurality of openings of the vibration transfer layer is larger than a size of the plurality of first electrodes.

19. The display device according to claim 13, wherein responsive to the voltage difference between the second electrode and at least one of the plurality of first electrodes, haptic cells corresponding to the at least one of the plurality of first electrodes vibrate in a vibration mode that is associated with a resonant frequency.

20. The display device according to claim 12, wherein at least one of the plurality of openings is quadrilateral in shape and at least one of the plurality of first electrodes that corresponds to the at least one of the plurality of first openings is quadrilateral in shape.

* * * * *